(12) United States Patent
Johnson

(10) Patent No.: US 8,065,551 B2
(45) Date of Patent: Nov. 22, 2011

(54) ADJUSTABLE BYTE LANE OFFSET FOR MEMORY MODULE TO REDUCE SKEW

(75) Inventor: Christopher S. Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 409 days.

(21) Appl. No.: 12/265,265

(22) Filed: Nov. 5, 2008

(65) Prior Publication Data
US 2009/0055675 A1 Feb. 26, 2009

Related U.S. Application Data

(63) Continuation of application No. 11/124,744, filed on May 9, 2005, now Pat. No. 7,457,978.

(51) Int. Cl.
*G06F 1/12* (2006.01)
*G06F 13/42* (2006.01)
*G06F 5/00* (2006.01)
*H04L 7/00* (2006.01)

(52) U.S. Cl. ......... 713/401; 713/400; 713/503; 711/100

(58) Field of Classification Search ................... 713/400, 713/401, 503; 711/100
See application file for complete search history.

(56) References Cited

U.S. PATENT DOCUMENTS

| | | | |
|---|---|---|---|
| 5,406,518 A | 4/1995 | Sun et al. | |
| 5,703,815 A | 12/1997 | Kuhara et al. | |
| 5,727,021 A | 3/1998 | Truebenbach | |
| 5,946,712 A | 8/1999 | Lu et al. | |
| 6,031,847 A | 2/2000 | Collins et al. | |
| 6,150,863 A | 11/2000 | Conn et al. | |
| 6,167,528 A * | 12/2000 | Arcoleo | 713/501 |
| 6,464,540 B1 | 10/2002 | Sato | |
| 6,484,299 B1 | 11/2002 | Larsen | |
| 6,629,222 B1 | 9/2003 | Jeddeloh | |
| 6,708,238 B1 | 3/2004 | Rotker | |
| 6,763,444 B2 | 7/2004 | Thomann et al. | |
| 6,832,277 B2 | 12/2004 | Durham et al. | |
| 6,887,336 B2 | 5/2005 | Kramer | |
| 6,963,989 B1 | 11/2005 | Cullum et al. | |
| 6,968,436 B2 | 11/2005 | Kumazawa | |
| 6,971,040 B2 | 11/2005 | Volk | |
| 6,998,892 B1 | 2/2006 | Nguyen et al. | |
| 7,039,822 B2 | 5/2006 | Faue et al. | |
| 7,051,225 B2 | 5/2006 | Nishio et al. | |
| 7,079,446 B2 | 7/2006 | Murtagh et al. | |
| 7,089,509 B2 * | 8/2006 | Emberling et al. | 716/108 |

(Continued)

*Primary Examiner* — Thomas Lee
*Assistant Examiner* — Jaweed A Abbaszadeh
(74) *Attorney, Agent, or Firm* — Wong, Cabello Lutsch, Rutherford & Brucculeri, LLP

(57) ABSTRACT

Disclosed herein are solutions for addressing the problem of skew of data within a byte lane by factors caused external to the integrated circuit or module providing the data. To compensate for such skew, an on-chip delay is added to the data out paths of those bits in the byte lane with otherwise would arrive early to their destinations. Such on-chip delay is provided delay circuits preferably positioned directly before the output buffers/bond pads of the integrated circuit or module. By intentionally delaying some of the outputs from the integrated circuit or module, external skew is compensated for so that all data in the byte lane arrives at the destination at substantially the same time. In a preferred embodiment, the delay circuits are programmable to allow the integrated circuit or module to be freely tailored to environments having different skew considerations, such as different styles of connectors.

20 Claims, 8 Drawing Sheets

U.S. PATENT DOCUMENTS

| | | |
|---|---|---|
| 7,110,276 B2 | 9/2006 | Park |
| 7,193,910 B2 | 3/2007 | Nobunaga et al. |
| 7,272,742 B2 * | 9/2007 | Schoenfeld et al. .......... 713/503 |
| 7,281,950 B2 | 10/2007 | Belopolsky |
| 2002/0091958 A1 | 7/2002 | Schoenfeld et al. |
| 2002/0174313 A1 | 11/2002 | Kuhn |
| 2002/0181214 A1 | 12/2002 | Levy et al. |
| 2002/0199126 A1 | 12/2002 | Volk |
| 2003/0046618 A1 | 3/2003 | Collins |
| 2003/0112827 A1 | 6/2003 | Cox et al. |
| 2005/0005184 A1 | 1/2005 | Lindt |
| 2005/0047187 A1 | 3/2005 | Park |
| 2005/0057987 A1 | 3/2005 | Fujimoto et al. |
| 2005/0226061 A1 | 10/2005 | Park |
| 2006/0164909 A1 * | 7/2006 | Gower et al. ................. 365/233 |

* cited by examiner

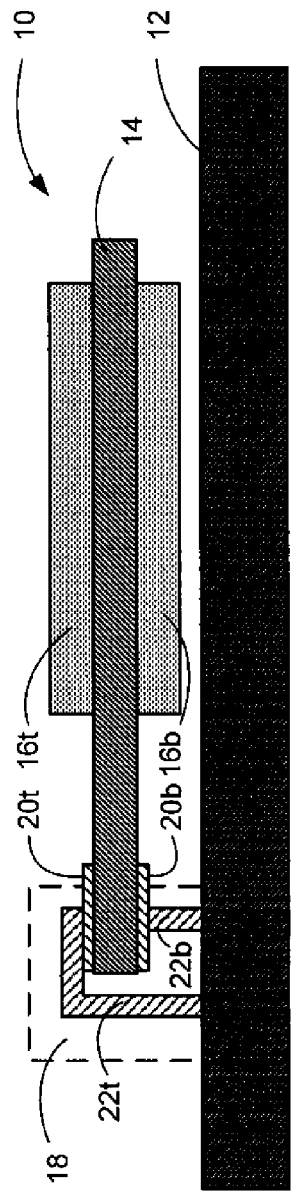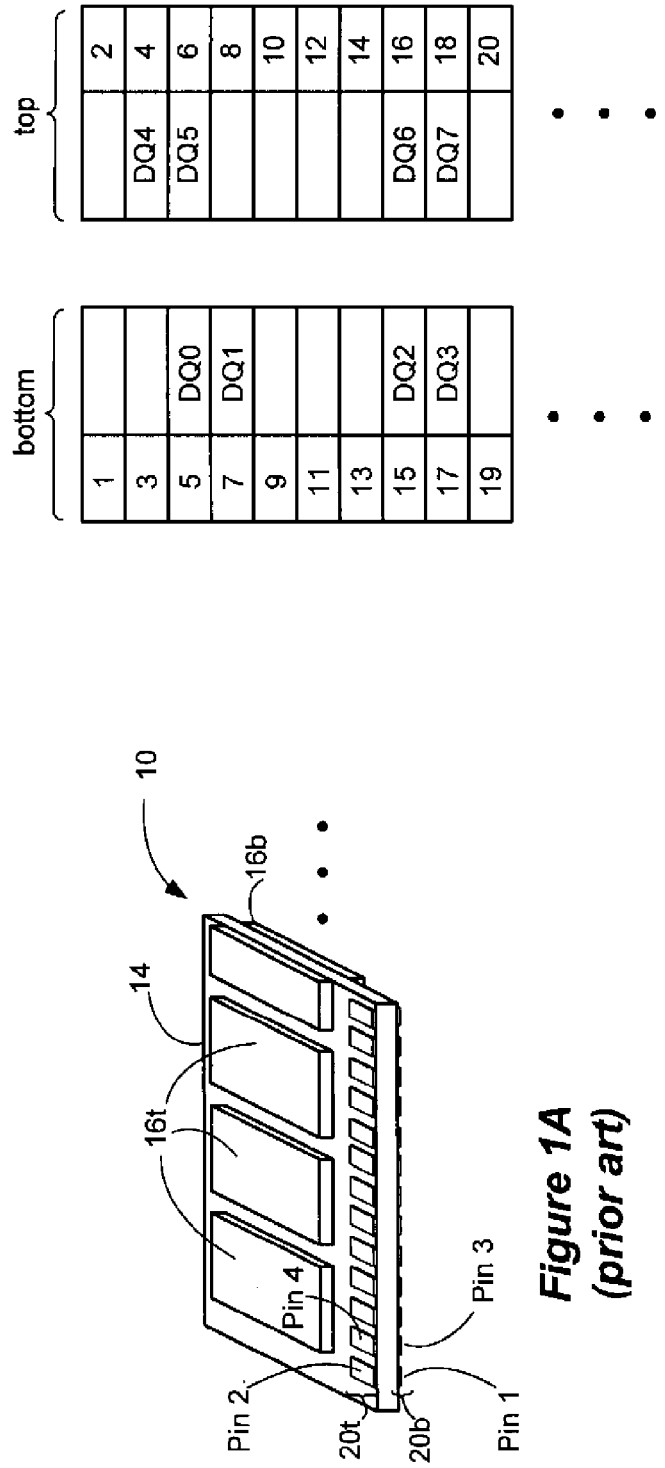
Figure 1B (prior art)
Figure 1C (prior art)
Figure 1A (prior art)

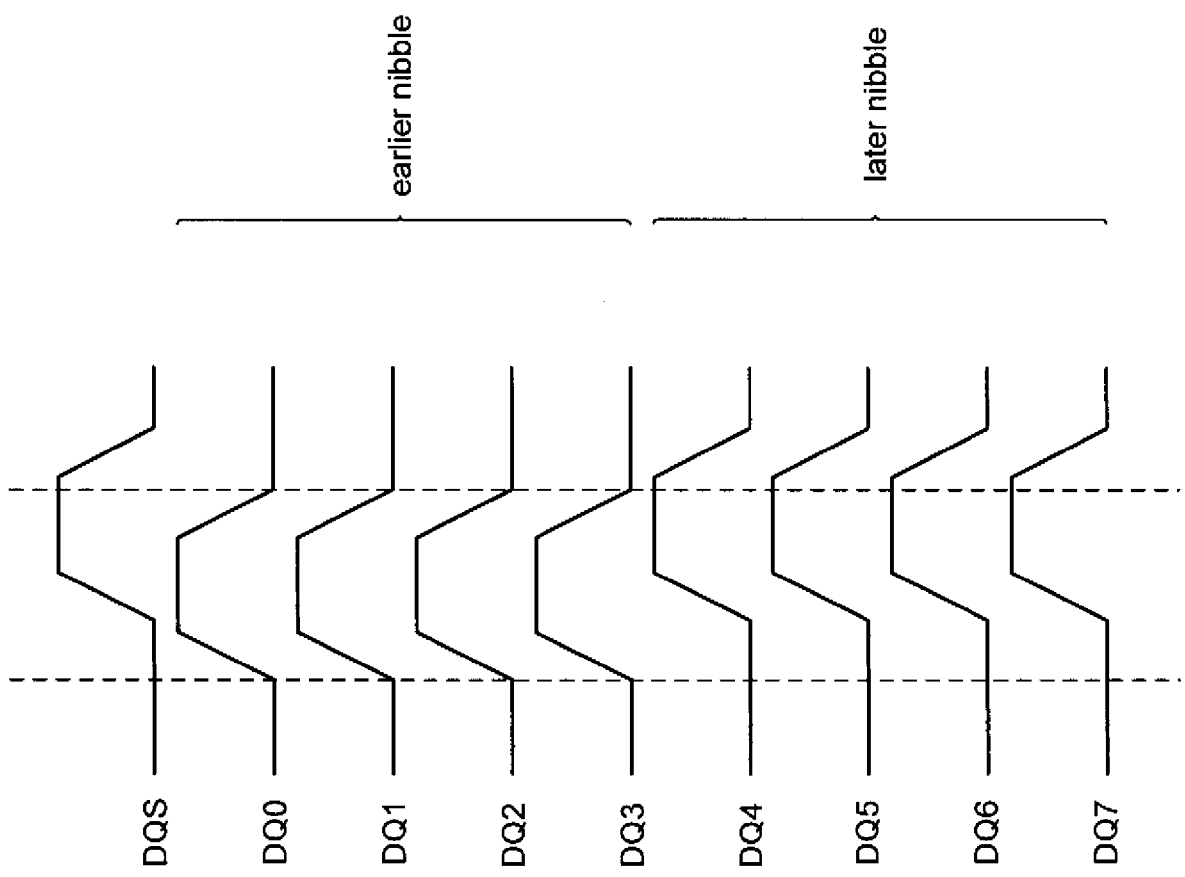

ADJUSTABLE BYTE LANE OFFSET FOR MEMORY MODULE TO REDUCE SKEW

CROSS REFERENCE TO RELATED APPLICATIONS

This is a continuation of U.S. patent application Ser. No. 11/124,744, filed May 9, 2005, to which priority is claimed and which is incorporated herein by reference in its entirety.

FIELD OF THE INVENTION

Embodiments of this invention relate to improving the skew in a byte lane in a memory module.

BACKGROUND

Memory modules (e.g., Single In-Line Memory Modules (SIMMs)), Dual In-Line Memory Modules (DIMMs), and Small Outline DIMMs (SODIMMs)) are common in the computer industry, and generally comprise a printed circuit board (PCB) having a number of memory chips thereon. Such memory chips are usually DRAM memory chips, and more typically synchronous DRAMs (e.g., DDRx DRAMs). By incorporating several memory chips on a single PCB, the modules can hold large amounts of data, and thus are useful in computing applications. Generally, data is retrieved from the module by a call from some master device that needs access to the data, e.g., a microprocessor, which typically calls for eight bits of data (i.e., a "byte") at one time.

A memory module 10 (shown in isolation in FIG. 1A) typically mounts to a system (such as mother board 12) by way of a connector 18, as shown in cross-section in FIG. 1B. In this particular example, the module 10 is a SODIMM module. SODIMM modules are useful in applications such as notebook computers because of their low profiles. This low profile is facilitated by the use of a 90-degree connector 18, which allows the module 10 to be positioned parallel to the mother board 12 when mounted in the connector 18.

The particular memory module 10 illustrated has memory chips 16 on the top (16t) and bottom (16b) of a PCB 14. As one skilled in the art will understand, the PCB 14 further contains contacts 20 at one edge of the PCB 14. These contacts 20 connect to pins on the memory chips 16t and 16b (not shown) via circuit traces in the PCB 14 (not shown). As illustrated, the contacts 20, like the memory chips, appear on the top (20t) and bottom (20b) of the PCB 14. Typically, such contacts are tinned or gold plated to ensure good electrical connection with the connector 18 as discussed further below.

When the memory module 10 is positioned within the connector 18 (e.g., by press fit, by the use of latches, or by other means in the art), as shown in FIG. 1B, the contacts 20 further connect to conductors 22 molded inside of the plastic connector body 18. These conductors 22 are in turn connected to traces on the mother board 12 (not shown) and ultimately to other electrical components on the mother board 12, such as a microprocessor (not shown). Because the conductors 22 communicate with both the top 20t and bottom 20b contacts, the conductors 22 within the connector 18 body will also be split into top (22t) and bottom (22b) conductors.

When the memory module 10 is so coupled to the mother board 12, it will be noticed that the electrical pathway between the contacts 20 and the motherboard 12 differs depending on whether top or bottom contacts are considered. This is because, by necessity, conductors 22t are longer than conductors 22b, e.g., by approximately 10 millimeters. As a result, the signals passing from the chips 16 through the top contacts 20t and top conductors 22t will arrive at the mother board 12 slightly delayed with respect to similar signals passing through the bottom contacts 20b and bottom conductors 22b.

This difference in length has a small, but potentially critical, effect on the timing of the signals that pass through the conductors 22. For example, suppose a microprocessor on the mother board 12 calls to the memory module to provide a byte of data (from outputs DQ0-DQ7). These signals (e.g., in a DDRx DRAM module) appear on opposite sides of the memory module 10, as shown in FIG. 1C. Specifically, the first four bits, DQ0-DQ3, or "nibble" of data corresponding to pins 5, 7, 15 and 17 on the module, are output on the bottom contacts 20b of the module. The other nibble, DQ4-DQ7, corresponding to pins 4, 6, 16, and 18 of the module 10, are output on the top contacts 20t of the module. (Although a typical DDRx DRAM module would have many dozens of pins, only a few are shown in FIG. 1C).

However, data from these module outputs will typically be called for at the same time, i.e., on a byte basis. When the microprocessor makes such a call, the length difference inside the connector will cause the data corresponding to the nibble DQ0-DQ3 to arrive at the mother board 12 slightly before nibble DQ4-DQ7, e.g., perhaps on the order of 50 picoseconds or so. That is to say, a 50 ps "skew" is introduced in the byte lane. While this delay is relatively small, it can represent a significant portion of the data valid window on a memory module containing high speed memory chips (e.g., 20% of the data valid window on a DDR3 DRAM module).

To put this problem into further perspective, FIG. 2 shows the timing of the signals comprising the byte lane as they reach the mother board 12. The data is accompanied by a data valid signal, DQS, which is also sent by the module 10 when the byte is called for—Essentially, DQS represents a signal which indicates to the calling entity, e.g., the microprocessor, when the data called for is valid. The DQS signal, as to this particular byte, is also provided on the top contact 20t of the module 10. As is shown, the DQS signal arrives at the motherboard when nibble DQ4-DQ7 also arrives, as they are all provided through the top contacts 20t of the module and the top conductors 22t of the connector 18. However, nibble DQ0-DQ3, outputs to the bottom contacts 20b of the module 10, and thus arrives earlier by virtue of its shorter path through conductors 22b in the connector 18. The result of this skew is that the DQS signal doesn't exactly accurately indicate to the microprocessor when valid data is necessarily present for the entirety of the byte lane.

This problem has been rectified in the prior art by adjusting the lengths of the electrical traces on the mother board. Specifically, the length of the traces between the connector 18 and, for example, the microprocessor on the mother board 12 were lengthened for the "earlier" nibble, DQ0-DQ3 in the present example. In other words, the mother board traces for the earlier nibble would be longer than those for the later nibble, DQ4-DQ7. In so doing, and assuming the increase trace length compensates for the timing differential caused by the connector conductors 22t and 22b, the signals will be provided to the microprocessor at the same time, overcoming this problem.

However, this prior art solution is not optimal. First, it requires the mother board design to account for delays caused by the connector 18 and to specifically engineer the trace lengths. This may be inconvenient. Moreover, an otherwise undesired diversion in the trace length (such as a serpentine) is required, and may not be possible if space does not permit on the mother board.

Second, such lengthening of trace lengths essentially tailors the mother board for a particular connector, rendering the motherboard non-optimal if other types of connectors are to be used. For example, consider the 0-degree connector 18 of FIG. 3. This connectors orients the module 10 perpendicularly to the mother board 12 when mounted, as would be typical in a desktop computer. Moreover, given this configuration, it can be seen that the conductors 22 inside of the connector 18 are of the same length. In other words, the 0-degree connector 18 of FIG. 3 does not cause the same skew problem between nibbles in the byte lane as does the 90-degree connector 18 of FIG. 1B. Therefore, if the trace lengths on the mother board 12 are optimized for a particular type of connector, the use of other connectors would be non-optimal. Hence, adjustment of trace lengths does not make for a universal solution.

SUMMARY

Disclosed herein are solutions for addressing the problem of skew of data within a byte lane by factors caused external to the integrated circuit or module providing the data. One such external factor can comprise the use of a connector with internal conductors of different lengths that adds skew to the integrated circuit's or module's byte lane, which otherwise is called and desired to be provided synchronously in parallel to its destination (e.g., a mother board or microprocessor). To compensate for such skew, an on-chip delay is added to the data out paths of those bits in the byte lane with otherwise would arrive early to their destinations. Such on-chip delay is provided delay circuits preferably positioned directly before the output buffers/bond pads of the integrated circuit or the integrated circuits on the module. By intentionally delaying some of the outputs from the integrated circuit or module, external skew is compensated for so that all data in the byte lane arrives at the destination at substantially the same time. In a preferred embodiment, the delay circuits are programmable to allow the integrated circuit or module to be freely tailored to environments having different skew considerations, such as different styles of connectors.

BRIEF DESCRIPTION OF THE DRAWINGS

Embodiments of the inventive aspects of this disclosure will be best understood with reference to the following detailed description, when read in conjunction with the accompanying drawings, in which:

FIG. 1A illustrates a perspective view of a prior art memory module.

FIG. 1B illustrates a cross-section of the module of FIG. 1A mounted to a mother board by a 90-degree connector.

FIG. 1C illustrates a table showing the pin outs on the module of FIG. 1A for exemplary bits in a byte lane.

FIG. 2 illustrates timing signals for bits in a byte lane to show the problem of skew within the byte lane, and resulting skew with a data valid signal.

DETAILED DESCRIPTION

The problem of skew of data within the byte lane of a memory module is solved by introducing an on-chip delay to certain output signals within the memory chips themselves. This on-chip delay is designed, in one embodiment, to compensate for skew that would otherwise be provided the connector (e.g., a 90-degree connector) used to connect the module to the mother board.

However, before the specific solution to this problem is addressed, it should be realized that the on-chip delay technique disclosed herein can be used in broader manners and different contexts. For example, the on-chip delay technique can used to compensate for skews appearing on any parallel stream of data, and is not limited to addressing skew within a byte lane per se. The on-chip delay technique can also be used to compensate for skews related to the use of external factors other than connectors, including skews introduced by other devices external to the memory chips. The technique can also be used with respect to skews internal to the chips themselves. While particular useful in the context of memory chips, and more specifically memory modules, the techniques are adaptable to other technologies as well, such as microprocessor and multi-chip modules more generally. The technique has further pertinence to individual integrated circuits not comprising portions of a module. In short, the on-chip delay technique provides a broad solution to many different potential problems of skew. Moreover, such on-chip delays can be made programmable, as explained further below.

In one embodiment, assume the specific problem of byte lane skew in a memory module introduced by the use of a 90-degree connector 18, such as shown in FIG. 1B. The solution to this specific problem does not require a programmable on-chip delay, as the delay associated with this particular connector 18 would be constant. Accordingly, a non-programmable delay can be used, with the goal of providing an approximately 50 ps delay to those nibbles in the byte lane (called the "earlier nibble") which would otherwise arrive at the mother board before the other nibble (the "later nibble").

Figure 4A:
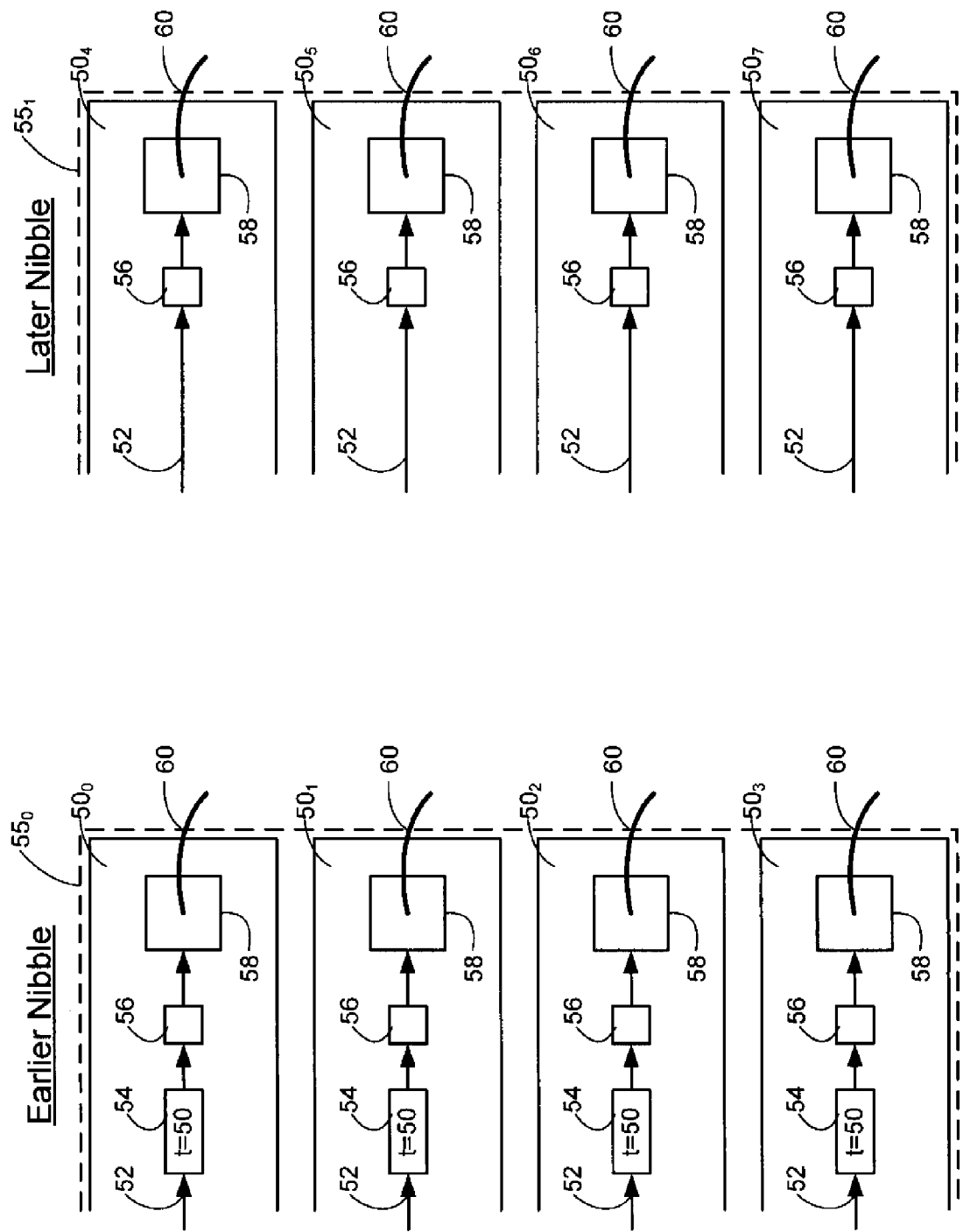
FIGS. 4A and 4B illustrate embodiment in delay circuits are selectively provided in the data output paths to provide a compensating skew in a byte lane of data.

This is illustrated in one embodiment in FIG. 4A. Shown are eight memory chips $50_0$-$50_7$ together representing a byte lane of data (DQ0-DQ7) from the memory module PCB on which the chips $50_x$ are mounted (not shown for clarity). Depicted for each chip $50_x$ is the data out path, which comprises an internal data out signal 52, a standard output buffer 56, a bond pad 58, and a bond wire that ultimately connects to the lead frame of the package in which the chips $50_x$ are positioned (not shown), and ultimately to the various contacts 20 (FIGS. 1A-B) on the module 10.

Figure 4B:
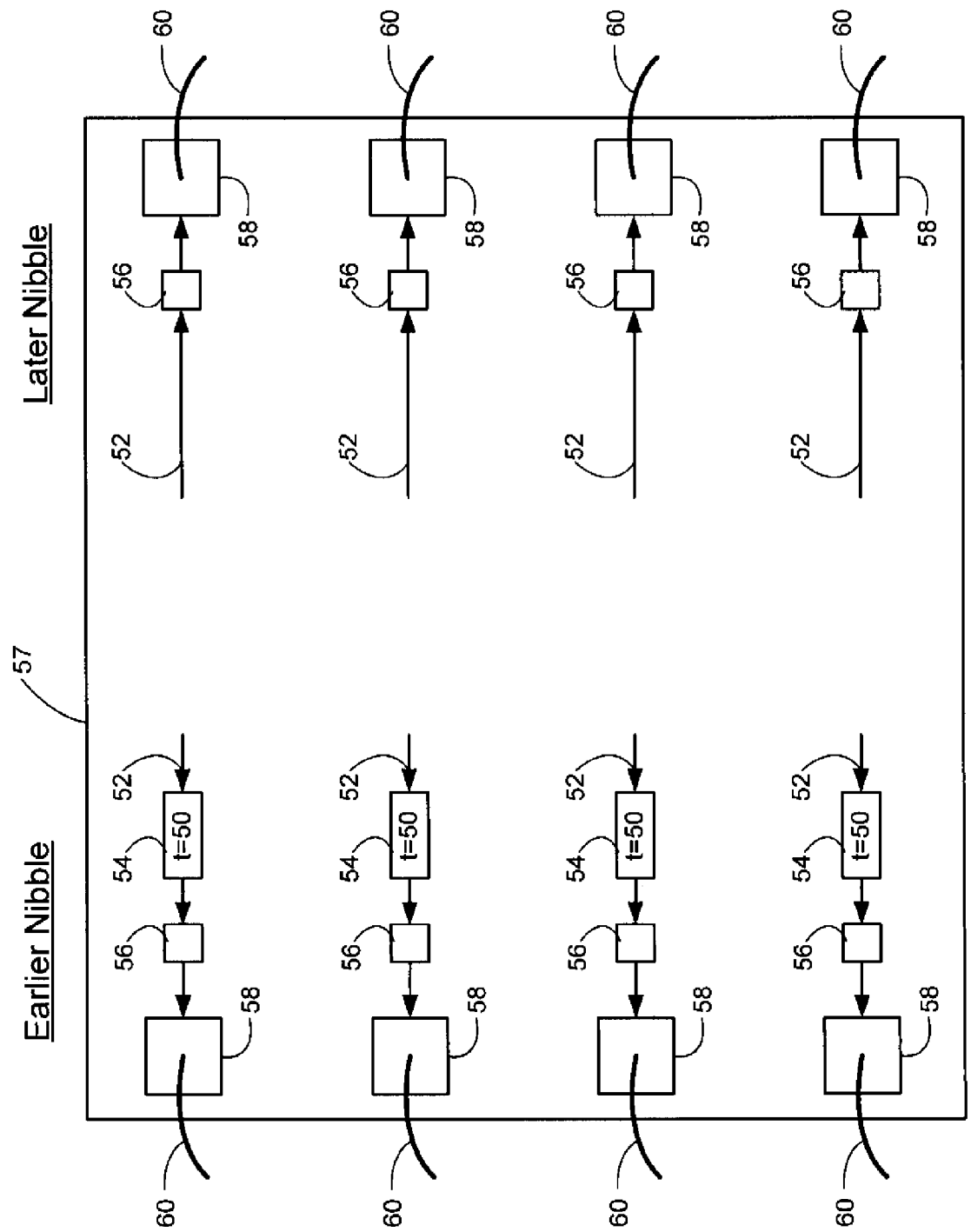

As depicted, it is assumed that each of the eight DQ signals on the module 10 is derived from one bit of each of the eight memory chips $50_x$. That is to say, it is assume that ×1 DRAMs are used. Of course, this need not be the case, and the various data paths comprising the module's byte lane may be integrated on one or more memory chips. For example, each of the nibbles may be provided by four separate outputs on two different memory chips $55_x$ (shown in dotted lines). More typically, in current-day DDR DRAMs modules, the eight data paths comprising a particular byte lane are all intergraded on one DRAM memory chip 57, as shown in FIG. 4B. In other words, typically ×8 or ×16 DRAMs are used, capable of outputting a byte or word of data in parallel. (Moreover, FIG. 4B illustrates the utility of the disclosed technique even when a call for data is made to a single integrated circuit).

In any event, as to the earlier nibble in the byte lane (DQ0-DQ3 in the example discussed earlier), a delay circuit 54 has been introduced between the data out signal 52 and the output buffer 56 so as to delay the signals on those data paths by an appropriate time (i.e., t=50 ps). The delay circuit 54 can be placed anywhere along the data path, including earlier "up stream" in the chip. Note that this delay circuit 54 does not appear in the later nibble in FIG. 4A or 4B. Accordingly, when the microprocessor for example calls for data from the byte lane, the earlier nibble will be delayed by the delay circuits 54 by 50 ps, just as the later nibble will be delayed by virtue of the additional length of the top conductors 22*t* (FIG. 1B) in the connector. The result is that the byte will arrive at the mother board with no or reduced skew. This allows the data valid window to be set around the arrival of data at the microprocessor with greater accuracy and buffer, without the need to lengthen any circuit traces on the mother board. Although not shown, the data valid signal, DQS, may also be delayed if necessary, more specifically if it were provided on the bottom side of the module, although this is unnecessary in the example discussed earlier (see FIG. 2).

Figure 5A:
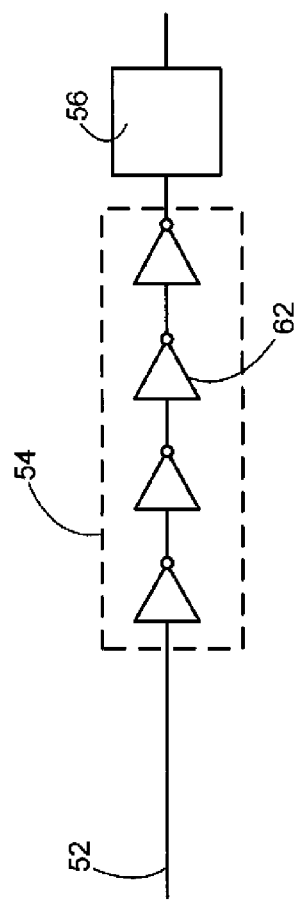
FIG. 5A illustrates a delay circuit useable in the context of FIGS. 4A and 4B.

FIG. 5A shows a simple way in which the on-chip delay circuit 54 can be fabricated. As shown, delay is introduced simply by providing a series of inverters 62. Each inverter 62 provides some amount of delay to the internal data out signal 52. Typically, this delay for a CMOS inverter is on the order of 10-20 ps for current CMOS technologies, and can be easily scaled by adjusting the gate lengths and widths of the NMOS and PMOS transistors which make up the inverter. (More specifically, and as one skilled in the art understands, the delay time of a CMOS inverter can be approximated by $\Delta t = C * \Delta Vdd/I$, where C is the capacitance of the load, Vdd is the power supply voltage, and I is the drive current. I can be adjusted by adjusting the width or length of the transistor). Therefore, assuming the transistors in the inverters 62 are properly scaled, a delay of approximately 15 ps (for example) can be achieved for each, with four in series providing a delay of approximately 60 ps, acceptably close to the 50 ps skew introduced by the 90-degree connector 18 (FIG. 1B). (An even number of inverters would be preferred to preserve the polarity of the internal data out signal 52).

Figure 3:
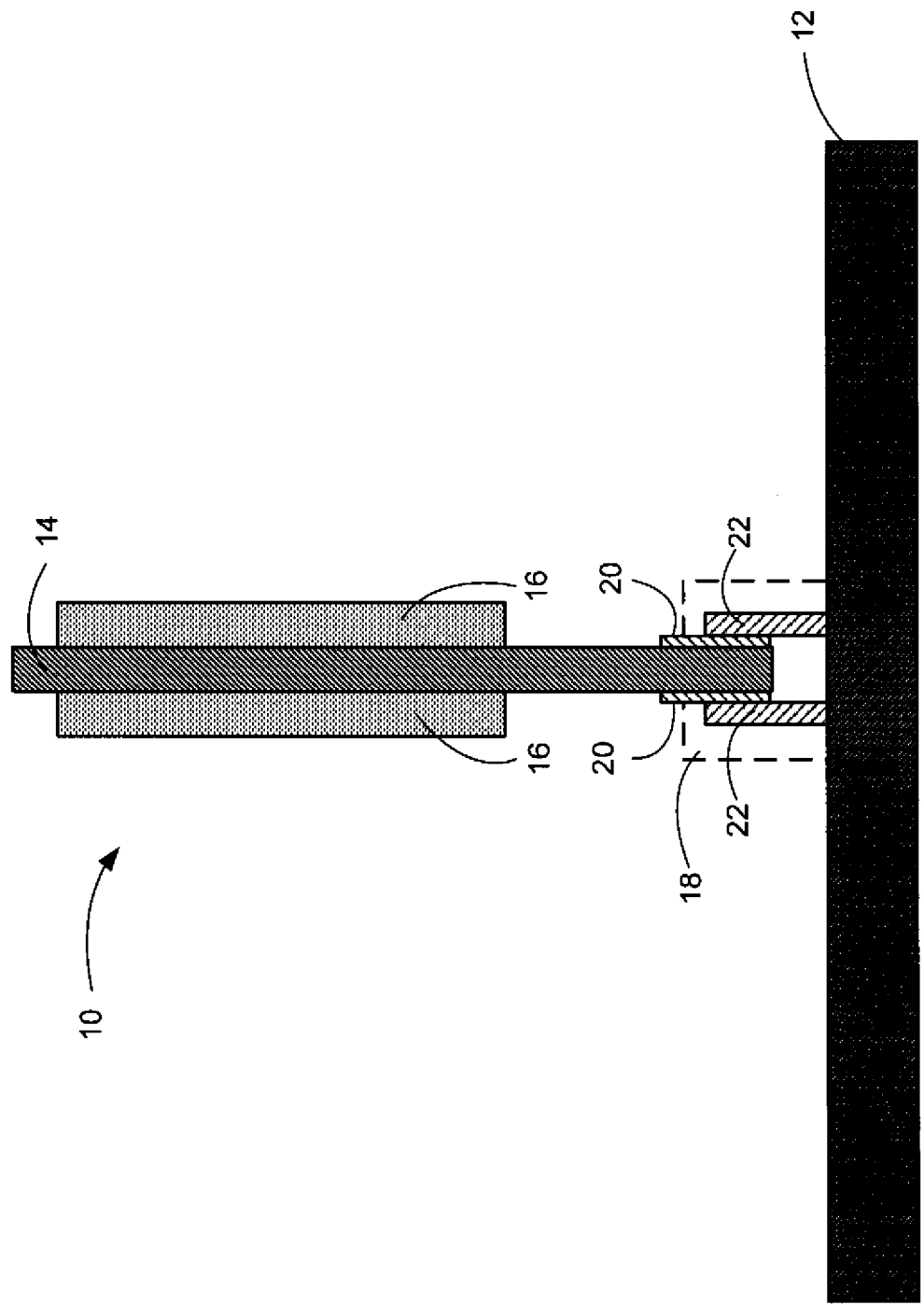
FIG. 3 illustrates the module of FIG. 1A mounted to a mother board by a 0-degree connector.

Even further preferable to the delay circuit 54 of FIG. 5A are delay circuits that are programmable. As applied to the byte lane data skew problem discussed above, programmability is desirable to provide greater flexibility in the type of connectors 18 (FIG. 1B) with which the modules can be used. As noted in the Background section, a given module 10 can be used with varying types of connectors 18, such as 90-degree (FIG. 1B) or 0-degree connectors (FIG. 3), and thus a fixed delay circuit 54 would not be optimal were it desired to use the module with either of these types of connector.

Figure 4C:
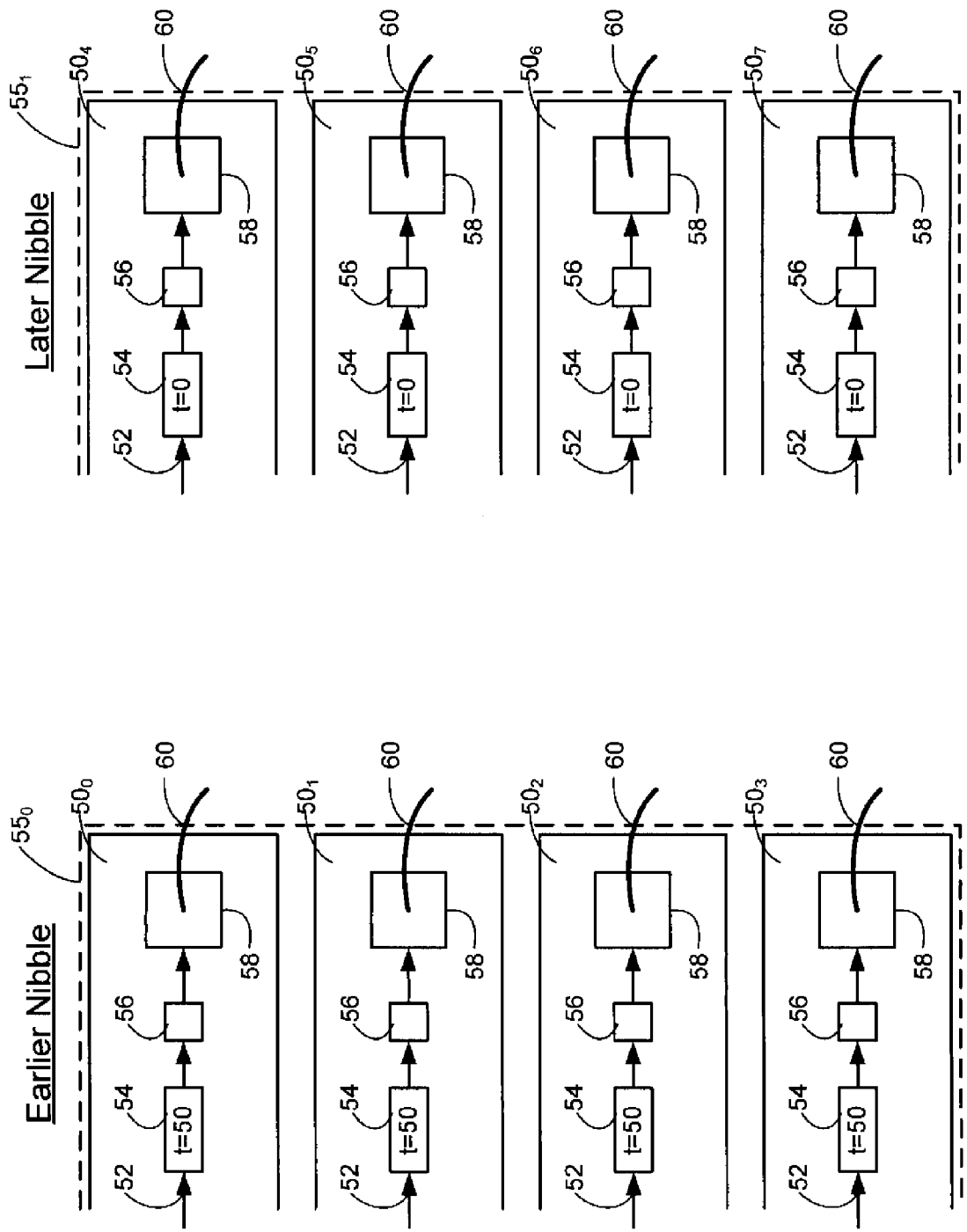
FIG. 4C illustrates an embodiment similar to FIG. 4A in which programmable delay circuits are used.

FIG. 4C illustrates the use of programmable delay circuits 54. In this example, and compared to FIG. 4A, it will be seen that each output comprising a bit in the byte lane has a delay circuit 54 in its data out path. However, no delay is set by the delay circuits in the later nibble (t=0), whereas the delay circuits 54 in the earlier nibble are once again set to approximately t=50 ps. Thus, the effect is the same as that shown in FIGS. 4A and 4B, except that now that chips 50$_x$, 55$_x$, or 57 can be made uniformly, and then later programmed to address the unique problems of skew present in the byte lane.

Figure 5B:
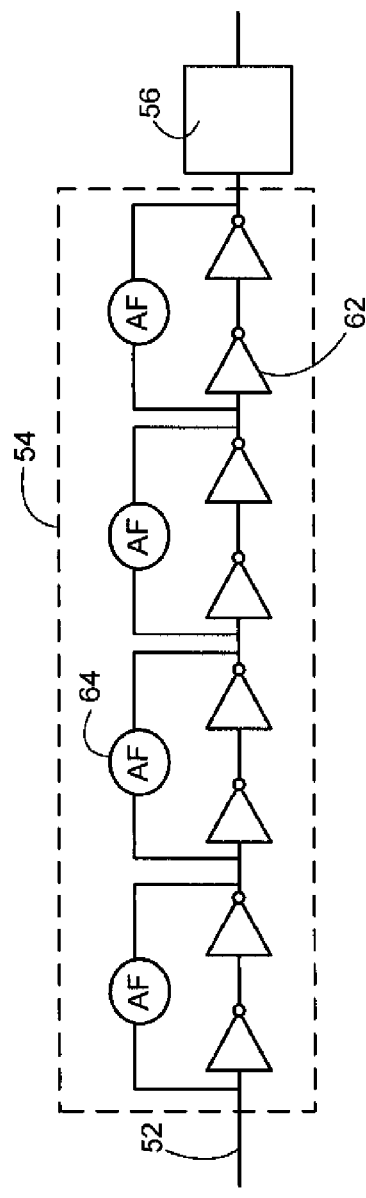
FIGS. 5B-5E illustrates programmable delay circuits useable in the context of FIG. 4C.
Figure 5C:
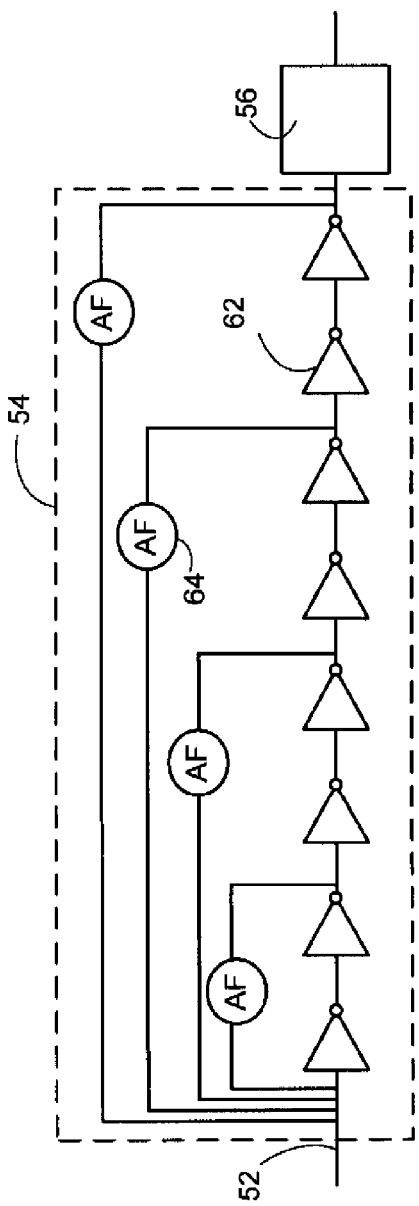

FIG. 5B illustrates a programmable delay circuit 54. Again, inverters 62 are used as the basic delay element, with antifuses (AF) 64 spanning every two inverters 62. In their unprogrammed state, the antifuses 64 act as open circuits, and hence a delay of eight inverter stages (e.g., 120 ps) would be introduced if none of the antifuses 64 are programmed; six stages if one of the antifuses are programmed; four stages if two of the antifuses are programmed; two stages if three of the antifuses are programmed; and no delay if all of the antifuses are programmed. FIG. 5C achieves this same programming ability, with the need to only program one antifuse to effect a delay between zero to eight inverter stages. As antifuses and methods for programming them are well known in the semiconductor art, the circuitry used to do so is not shown.

Figure 5D:
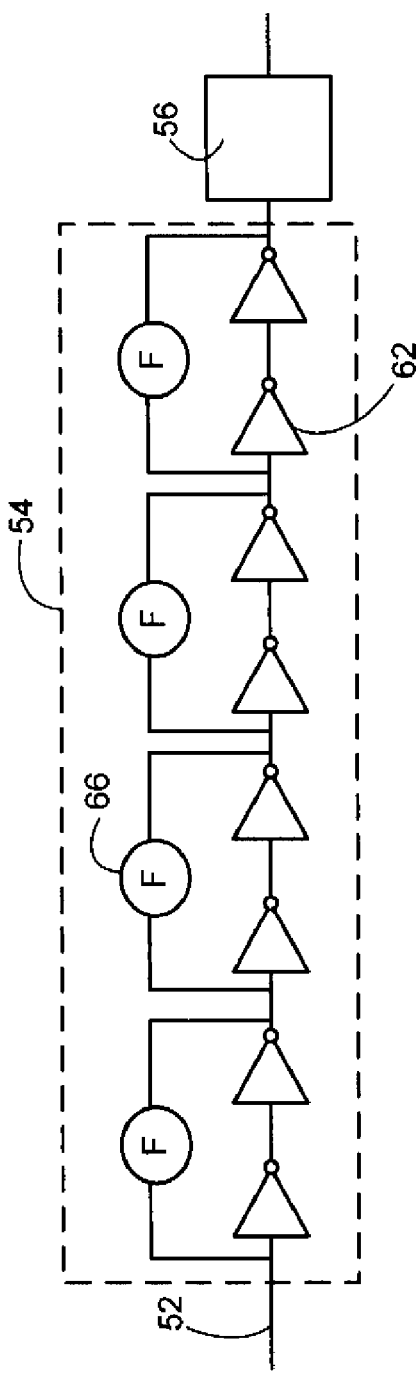
Figure 5E:
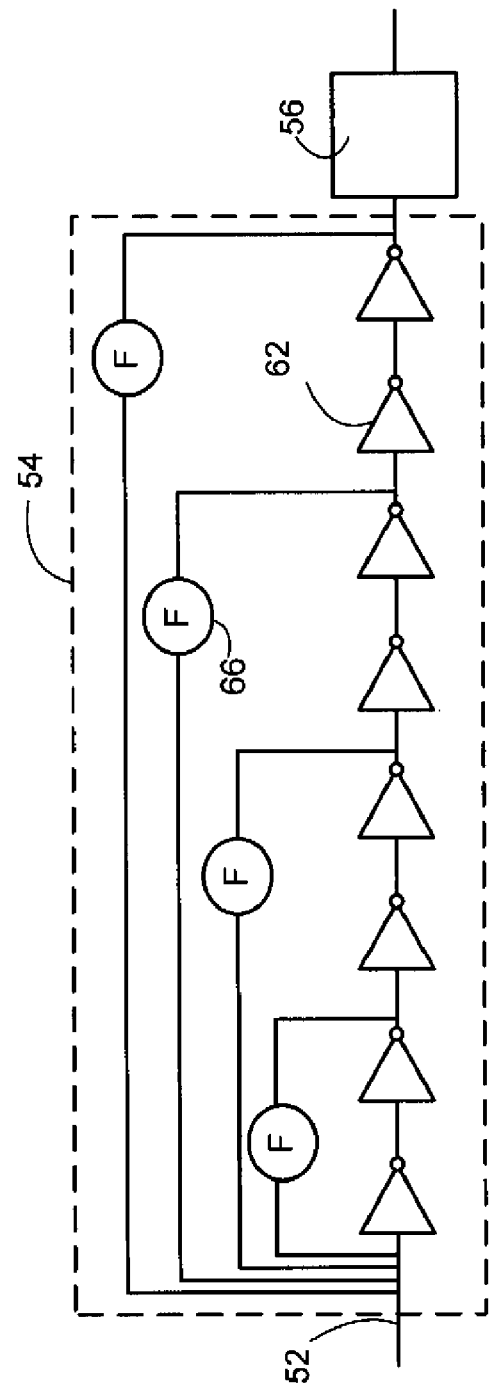

Fuses could also be used, as illustrated in FIGS. 5D and 5E. In their unprogrammed state, the fuses 66 act as short circuits, and hence no delay would be introduced if none of the fuses 66 are programmed in FIG. 5D; two inverter stages of delay if one of the fuses are programmed; four stages if two of the fuses are programmed; six stages if three of the fuses are programmed; and eight stages if all of the fuses are programmed. FIG. 5E achieves this same programming ability, with the need to only program one fuse to effect a delay between zero to eight inverter stages. As fuses and methods for programming them are well known in the semiconductor art, the circuitry used to do so is not shown. The fuses 66 may be either programmable by signal (i.e., by the application of a voltage across the fuse), or by light (e.g., by laser ablation).

Such one-time programmable approaches are destructive. Once programmed, the chips 50 (and the modules in which they reside), are permanently tailored for a particular operating environment and/or connector. Therefore, and even further preferable approach to the delay circuit 54 are many-times programmable circuits whose delay can be readily changed. This would allow a module, for example, to be freely tailored for use in any operating environment at any time, even if previously programmed for a certain operating environment. One simple way of doing do, not illustrated in the Figures, would be to substitute an Erasable Programmable Read Only Memory (EPROM) cell for either the antifuses 64 of fuses 66 of FIGS. 5B-5E. Such a cell could be UV erasable using radiation or electrically erasable via application of an erase voltage. Again, such techniques are well known in the art.

Programming of the delay circuits on the memory chips can take place using an on chip mode register. As one skilled in the art understands, a mode register contains various settings used to tailor the operation of the chip. The mode register can be programmed using special test modes, usually by activating otherwise standard control signals on the chips or the module in unique sequences. Using such a standard technique, the delay value for each of the delay circuit can be easily programmed. Such programming could occur at the chip level (i.e., before the chips are mounted to a PCB), or at the board level (i.e., after mounting to the module PCB).

Of course, the use of serially-connected inverters 62 is only one way of creating a delayed signal on of earlier nibble. One skilled in the art will recognize that many different types of fixed, one-time programmable, or freely programmable delay circuits can be used to achieve the goal of delaying the internal data out signal 52. For example, other logic gates can be used, varying capacitances can be provided to achieve a desired granularity in the delay on the internal data out signal, etc.

As used herein, a "mother board" need be only another board for communicating with the memory module. While such a board would typically contain a system microprocessor were the memory module to be used in a traditional computer configuration, this is not strictly necessary. Any board capable of calling the memory module could comprise the mother board, regardless of its configuration and function.

It should be understood that the inventive concepts disclosed herein are capable of many modifications. To the extent such modifications fall within the scope of the appended claims and their equivalents, they are intended to be covered by this patent.

What is claimed is:

1. A system, comprising:
a module comprising a circuit board having a plurality of circuits thereon, each circuit having at least one data path internal to the circuit, the data paths coupling to module outputs on the circuit board;
a delay circuit in the data path of at least one of the circuits, wherein the delay circuits are programmable; and
a connector for coupling the module outputs to a mother board, wherein the connector comprises conductors of different lengths so as to introduce a delay,
wherein a call from the mother board to the module for parallel data from the module outputs results in some, but not all, of the data being delayed at the module outputs by the at least one delay circuit so as to compensate for the delay introduced by the conductors in the connector, whereby the data arrives at the mother board at substantially the same time.

2. The system of claim 1, wherein the module is a memory module, and the circuits are memory integrated circuits.

3. The system of claim 1, wherein the data paths of all of the circuits comprise a delay circuit, but wherein only certain delay circuits are programmed to result in the data being delayed at the module outputs.

4. The system of claim 1, wherein the delay circuits are programmable to different delay values.

5. The system of claim 1, wherein the connector is a 90-degree connector with top conductors and bottom conductors for orienting the module parallel to the mother board, wherein the top conductors are longer than the bottom conductors.

6. The system of claim 5, wherein the data delayed at the module outputs couples to the bottom conductors.

7. The system of claim 6, wherein the data called comprises a byte of data, and wherein the data delayed at the circuit outputs comprise a nibble of the byte of data.

8. A method for calling data from a module, the module comprising a plurality of circuits having data coupled to a mother board via a connector, wherein the connector comprises conductors of different lengths so as to introduce a delay, comprising:
programming at least one of the circuits to effect the delaying of some, but not all, of the data at outputs of the module; and
calling from the mother board to the module for parallel data from the plurality of circuits,
wherein the programming step compensates for the delay introduced by the conductors in the connector, whereby by virtue of the delay the data arrives at the mother board at substantially the same time.

9. The method of claim 8, wherein all of the circuits comprise a delay circuit, but wherein only certain delay circuits are programmed to result in delaying some, but not all, of the data at the module outputs of the module.

10. A module, comprising:
a circuit board having a plurality of first circuits on a first side of the circuit board and a plurality of second circuits on a second side of the circuit board, each first and second circuits having at least one output data path internal thereto, wherein the output data paths are coupled module outputs on the circuit board; and
a delay circuit in the output data paths of each of the first or second circuits, wherein the delay circuits are programmable,
wherein a call to the module for parallel data from the module outputs results in data from the first circuits being delayed at the module outputs by the delay circuits in the first circuits, but wherein the call to the module for parallel data from the module outputs results in data from the second circuits not being delayed at the module outputs by the delay circuits in the second circuits.

11. The module of claim 10, wherein the delay circuits are destructively programmable.

12. The module of claim 10, wherein the delay circuits are many-times programmable.

13. The module of claim 10, wherein the delay circuits are programmable to different delay values.

14. The module of claim 10, wherein the data comprises a byte of data, and wherein a nibble of the data is delayed.

15. A method for calling data from a module, the module comprising a circuit board with a plurality of module outputs and a plurality of first circuits with data therein on a first side of the circuit board and a plurality of second circuits with data therein on a second side of the circuit board, wherein the first and second circuits are coupled to the module outputs, and wherein the first and second circuits each and have a delay circuit, comprising:
programming the delay circuits for at least the first circuits to result in delaying the data from the first circuits relative to the data from the second circuits; and
calling to the module for parallel data from the module outputs.

16. The method of claim 15, wherein the call to the module is made by another system, and wherein the programmed delay results in the called data arriving at the another system at substantially the same time.

17. The method of claim 15, wherein the delay circuits are in output data paths in the first circuit.

18. The method of claim 15, wherein programming the delay circuits for at least the first circuits comprises programming the delay circuits for the first and second circuits.

19. The method of claim 15, wherein the module is a memory module, and the first and second circuits are memory integrated circuits.

20. The method of claim 15, wherein the first circuits are coupled to module outputs on the first side of the circuit board, and wherein the second circuits are coupled to module outputs on the second side of the circuit board.

* * * * *